United States Patent
Masleid et al.

(10) Patent No.: US 8,214,790 B2
(45) Date of Patent: Jul. 3, 2012

(54) LOW RC GLOBAL CLOCK DISTRIBUTION

(75) Inventors: Robert P. Masleid, Monte Sereno, CA (US); James Ballard, Palo Alto, CA (US)

(73) Assignee: Oracle America, Redwood Shores, CA (US)

( * ) Notice: Subject to any disclaimer, the term of this patent is extended or adjusted under 35 U.S.C. 154(b) by 569 days.

(21) Appl. No.: 12/397,941

(22) Filed: Mar. 4, 2009

(65) Prior Publication Data

US 2010/0229142 A1 Sep. 9, 2010

(51) Int. Cl.
*G06F 17/50* (2006.01)

(52) U.S. Cl. ......... 716/139; 716/113; 716/119; 716/126

(58) Field of Classification Search .................. 716/113, 716/119, 126, 139
See application file for complete search history.

(56) References Cited

U.S. PATENT DOCUMENTS 7,555,741 B1 * 6/2009 Milton et al. ................. 716/101

* cited by examiner

*Primary Examiner* — Thuan Do

(74) *Attorney, Agent, or Firm* — Osha • Liang LLP

(57) ABSTRACT

A semiconductor die includes: a clock distribution network that distributes a clock signal within the die. The clock distribution network includes: a clock tree corresponding to one or more metal layers of the die, a plurality of clock spines corresponding to a metal layer of the die, a plurality of clock wings corresponding to a metal layer of the die, a plurality of clock grid drivers placed in one or more gaps of a floorplan corresponding to the semiconductor layer of the die, a clock grid placed in the one or more gaps of the floorplan, a plurality of buffers placed in a local gain buffer pair configuration wherein the local gain buffer pair connects the clock grid to a shorting bar, and a plurality of conductors that connect the shorting bar to a plurality of loads.

17 Claims, 11 Drawing Sheets

LOW RC GLOBAL CLOCK DISTRIBUTION

BACKGROUND OF INVENTION

The quality of the distribution of clock signals within a semiconductor device impacts the frequency performance of the semiconductor device. Modern semiconductor devices have poor matching between individual devices or wires, yet it is desirable to minimize the skew among the numerous branches of a clock distribution network. Further, minimizing the delay through the clock distribution network reduces error. Roughly half of the total clock distribution delay is due to wire propagation delay.

SUMMARY OF INVENTION

According to one aspect of one or more embodiments of the present invention, a method of designing a semiconductor die with a flexible floorplan includes: arranging a plurality of bumps corresponding to a bump layout of the die, placing a plurality of blocks in a floorplan corresponding to a semiconductor layer of the die, placing a clock tree corresponding to one or more metal layers of the die, placing a plurality of clock spines corresponding to a metal layer of the die, and placing a plurality of clock wings corresponding to a metal layer of the die. The clock wings connect one or more of the plurality of clock spines to the clock tree.

According to one aspect of one or more embodiments of the present invention, a method of designing a semiconductor die with a low RC global clock distribution includes: arranging a plurality of bumps corresponding to a bump layout of the die, placing a plurality of blocks in a floorplan corresponding to a semiconductor layer of the die, placing a clock tree corresponding to one or more metal layers of the die, placing a plurality of clock spines corresponding to a metal layer of the die, placing a plurality of clock wings corresponding to a metal layer of the die. The clock wings connect one or more of the plurality of clock spines to the clock tree. The method further includes: placing a plurality of clock grid drivers in one or more gaps of the floorplan, placing a clock grid in the one or more gaps of the floorplan wherein the clock grid drivers connect one or more of the clock spines to the clock grid, placing a plurality of buffers in a local gain buffer pair configuration wherein the local gain buffer connects the clock grid to a shorting bar, and placing a plurality of conductors that connect the shorting bar to a plurality of loads.

According to one aspect of one or more embodiments of the present invention, a semiconductor device includes: a mechanical package and a semiconductor die. The semiconductor die includes: a semiconductor layer, a plurality of metal layers, a clock distribution network that distributes a clock signal within the die, and a plurality of bumps that connect the die to the mechanical package. The clock distribution network includes a low RC global clock distribution. The low RC global clock distribution includes: a clock tree corresponding to one or more metal layers of the die, a plurality of clock spines corresponding to a metal layer of the die, a plurality of clock wings corresponding to a metal layer of the die wherein the clock wings connect one or more of the clock spines to the clock tree, a plurality of clock grid drivers placed in one or more gaps of a floorplan corresponding to the semiconductor layer of the die, a clock grid placed in the one or more gaps of the floorplan wherein the clock grid drivers connect one or more of the clock spines to the clock grid, a plurality of buffers placed in a local gain buffer pair configuration wherein the local gain buffer pair connects the clock grid to a shorting bar, and a plurality of conductors that connect the shorting bar to a plurality of loads.

According to one aspect of one or more embodiments of the present invention, a system includes: an input device, an output device, a mechanical chassis, a printed circuit board, and a semiconductor device. The semiconductor device includes: a mechanical package and a semiconductor die. The semiconductor die includes: a semiconductor layer, a plurality of metal layers, a clock distribution network that distributes a clock signal within the die, and a plurality of bumps that connect the die to the mechanical package. The clock distribution network includes a low RC global clock distribution. The low RC global clock distribution includes: a clock tree corresponding to one or more metal layers of the die, a plurality of clock spines corresponding to a metal layer of the die, a plurality of clock wings corresponding to a metal layer of the die wherein the clock wings connect one or more of the clock spines to the clock tree, a plurality of clock grid drivers placed in one or more gaps of a floorplan corresponding to the semiconductor layer of the die, a clock grid placed in one or more gaps of the floorplan wherein the clock grid drivers connect one or more of the clock spines to the clock grid, a plurality of buffers placed in a local gain buffer pair configuration wherein the local gain buffer pair connects the clock grid to a shorting bar, and a plurality of conductors that connect the shorting bar to a plurality of loads.

Other aspects of the present invention will be apparent from the following description and the appended claims.

DETAILED DESCRIPTION

Figure 1:
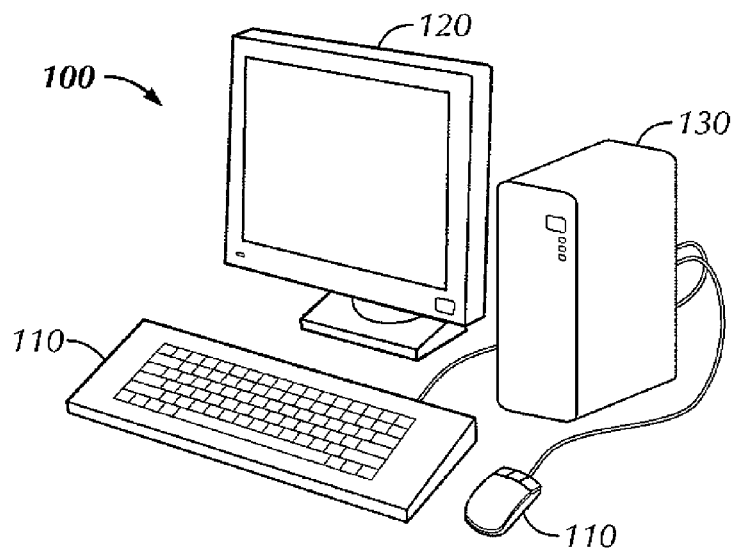
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system in accordance with one or more embodiments of the present invention. A system 100 includes an input device 110, an output device 120, and a mechanical chassis 130. The mechanical chassis 130 includes a printed circuit board, a network device, and a storage device (not shown).

Figure 2:
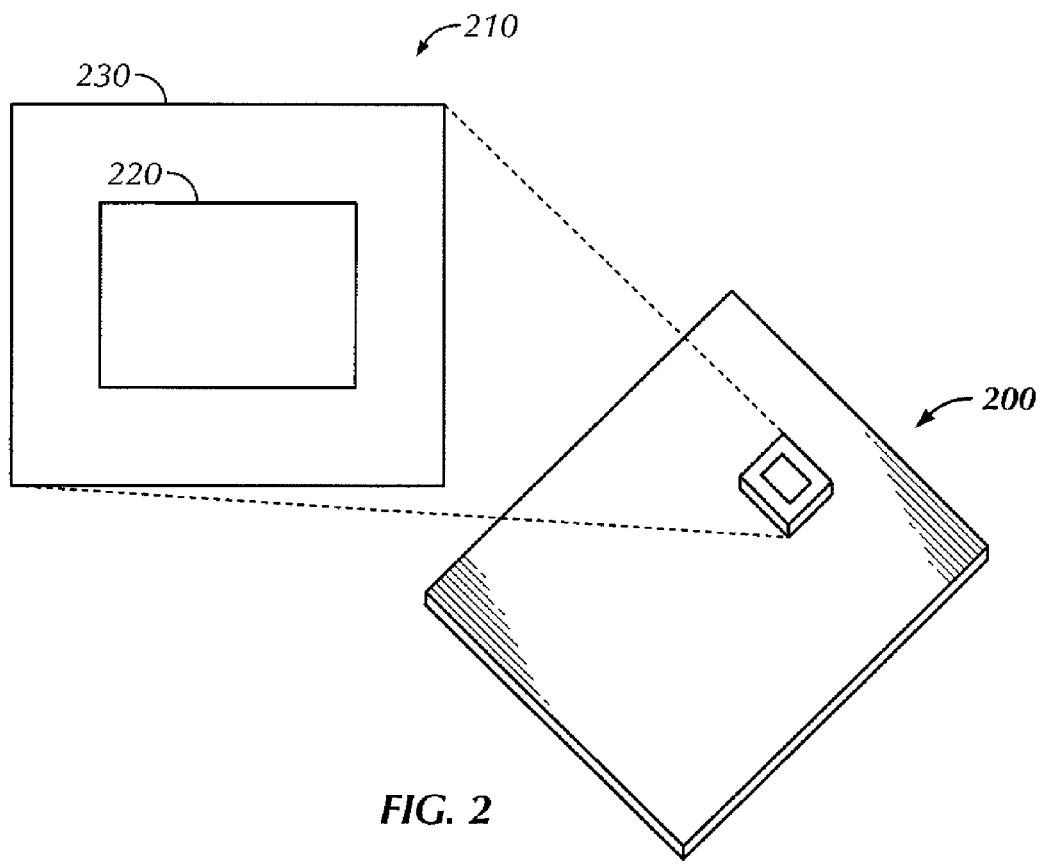
FIG. 2 shows a printed circuit board that includes one or more semiconductor device(s) that each includes one or more semiconductor die in accordance with one or more embodiments of the present invention.

FIG. 2 shows a printed circuit board that includes one or more semiconductor device(s) that each includes one or more semiconductor die in accordance with one or more embodiments of the present invention. A printed circuit board ("PCB") 200 includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 220. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. As such, clock distribution networks are used to provide the clock signals to the proper loads within the die.

The clock distribution network is organized as a hierarchy of three functional layers that distribute the clock within the semiconductor die: the tree layer, the grid layer, and the local layer. The tree layer includes a fractal clock tree that spans a large area of the die. One of ordinary skill in the art will recognize that fractals are hierarchical patterns comprised of unit tiles. The unit tiles are comprised of one or more elements. The elements at each level of the hierarchy are similar, but scaled based on the position of the elements within the hierarchy (self-similarity). The grid layer includes the clock routes to the individual clock users via a clock grid. The local layer includes the clock routes to the actual flip-flops and latches.

In the conventional art, the clock distribution locks the die floorplan to the bump layout. Because of schedule constraints in the semiconductor manufacturing process, the bump layout is typically frozen months in advance, e.g., approximately 4 months for ceramic packages, of the tape-out of the die. Thus, the clock distribution and die floorplan are also frozen months in advance of the tape-out of the die. In one or more embodiments of the present invention, the clock distribution is flexible and can accommodate an arbitrary die floorplan with low RC skew and economical power usage.

Figure 3:
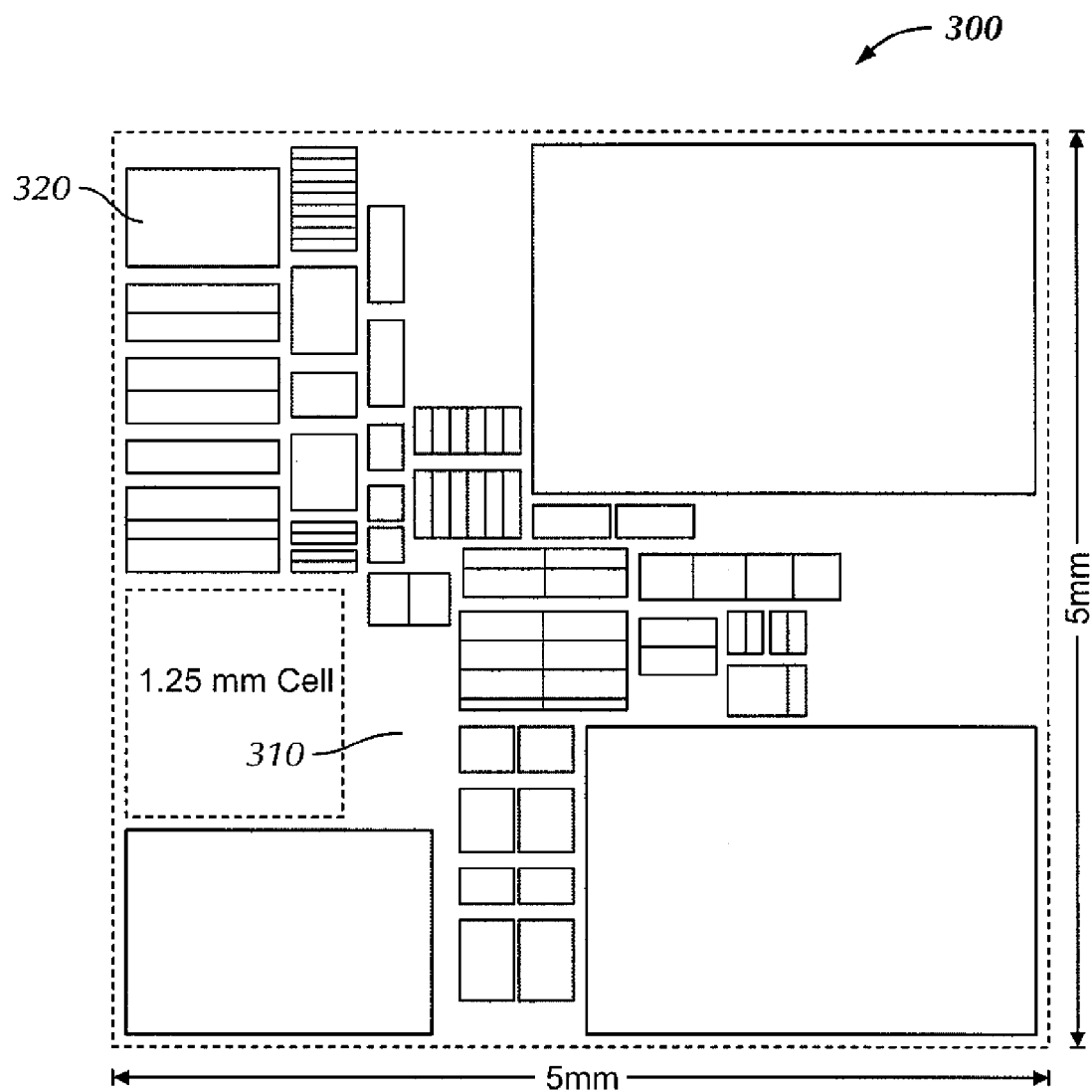
FIG. 3 shows an exemplary floorplan of a cluster of a die in accordance with one or more embodiments of the present invention.

FIG. 3 shows an exemplary floorplan of a cluster of the die in accordance with one or more embodiments of the present invention. The die 220 is comprised of a plurality of clusters. The exemplary cluster 300 is a 5 mm×5 mm portion of the semiconductor die. One of ordinary skill in the art will recognize that the cluster size could vary in accordance with one or more embodiments of the present invention. The floorplan 310 is comprised of a plurality of blocks, e.g., block 320. Each block represents a cell, a circuit or a portion of a circuit. During the physical design process, the blocks are placed within the cluster. The blocks are placed according to one or more constraints relating to the required connectivity, the clock distribution, the power distribution, and timing constraints. In one or more embodiments of the present invention, the floorplan is only constrained by the space required for the placement of clock grid drivers (not shown) and gaps within the block to accommodate the clock grid (not shown) or the use of blocks smaller than the corresponding portion of the clock grid.

Figure 4:
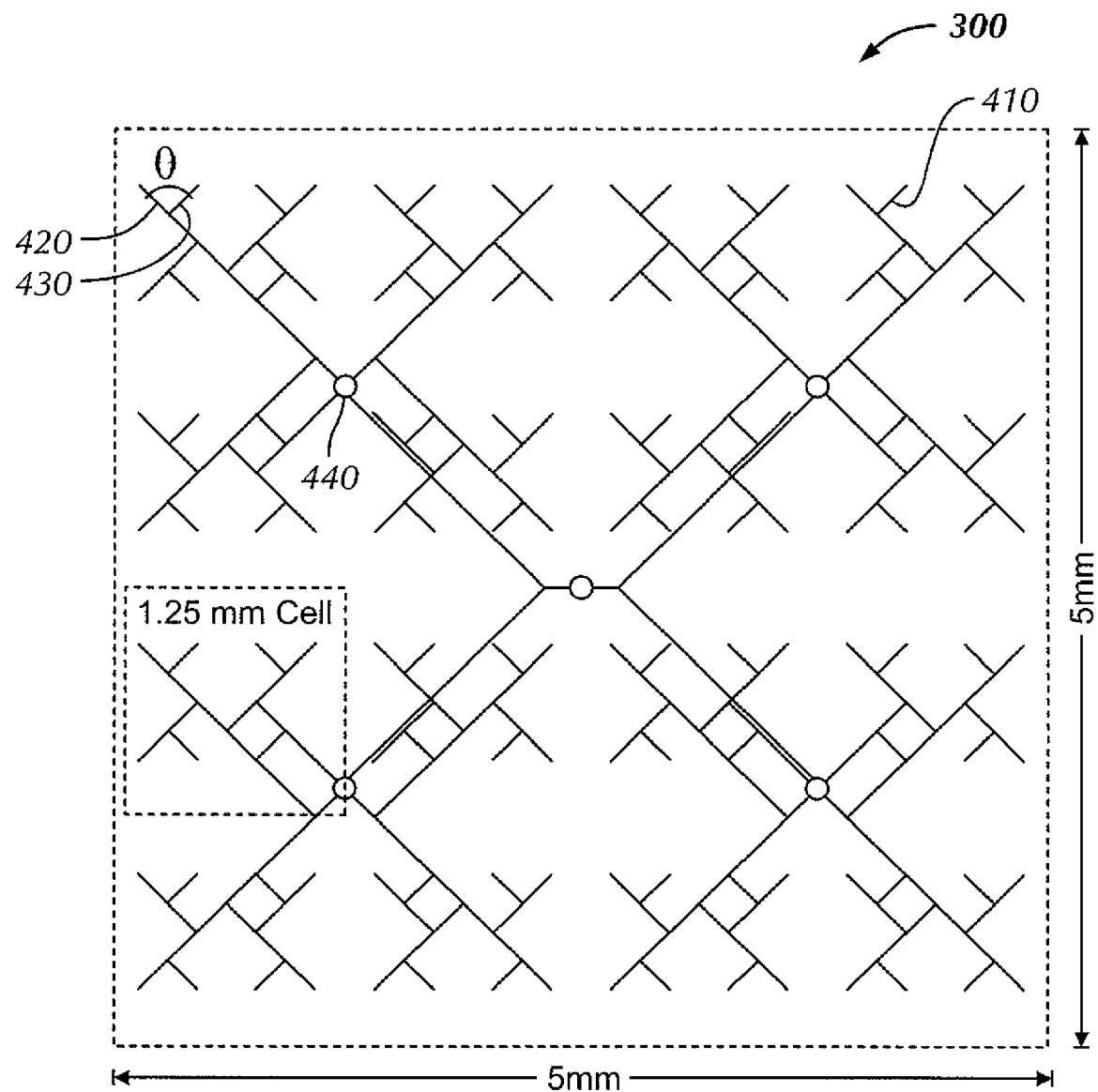
FIG. 4 shows an exemplary portion of a clock tree corresponding to the cluster of the die in accordance with one or more embodiments of the present invention.

FIG. 4 shows an exemplary portion of a clock tree corresponding to the cluster of the die in accordance with one or more embodiments of the present invention. The clock tree 410 is comprised of wires, e.g., wires 420 and 430, arranged at a planar angle of 45 degrees. The use of diagonal routes minimizes the maximum distance from source to destination and provides for a reduction in length of approximately 30% over a Manhattan-routed H-tree distribution. Clock repeaters, e.g., clock repeater 440, are placed as needed throughout the clock tree 410. Because the diagonal routes minimize the maximum distance from source to destination, fewer clock repeaters are required. The clock tree 410 may span one or more metal layers of the die.

Figure 5:
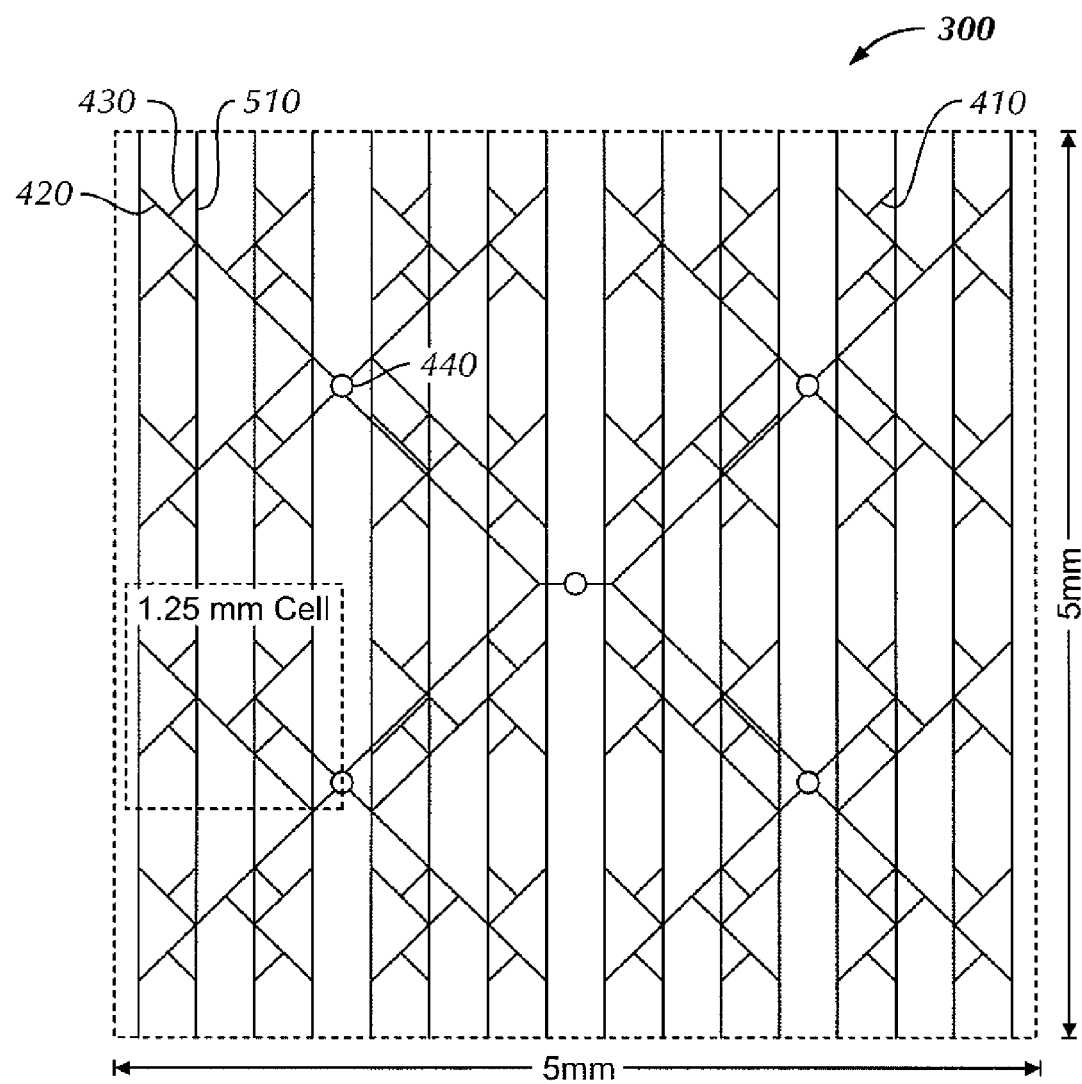
FIG. 5 shows the exemplary portion of the clock tree with clock spines in accordance with one or more embodiments of the present invention.

FIG. 5 shows the exemplary portion of the clock tree with clock spines in accordance with one or more embodiments of the present invention. The clock tree 410 drives a plurality of clock spines, e.g., clock spine 510, which span the length of the cluster in the Y-axis direction. The clock spines are located on a single metal layer of the die. The clock spines may be located on a metal layer that includes a portion of the clock tree 410. Alternatively, the clock spines may connect to the clock tree 410 from an alternate metal layer through a plurality of vias.

Figure 6:
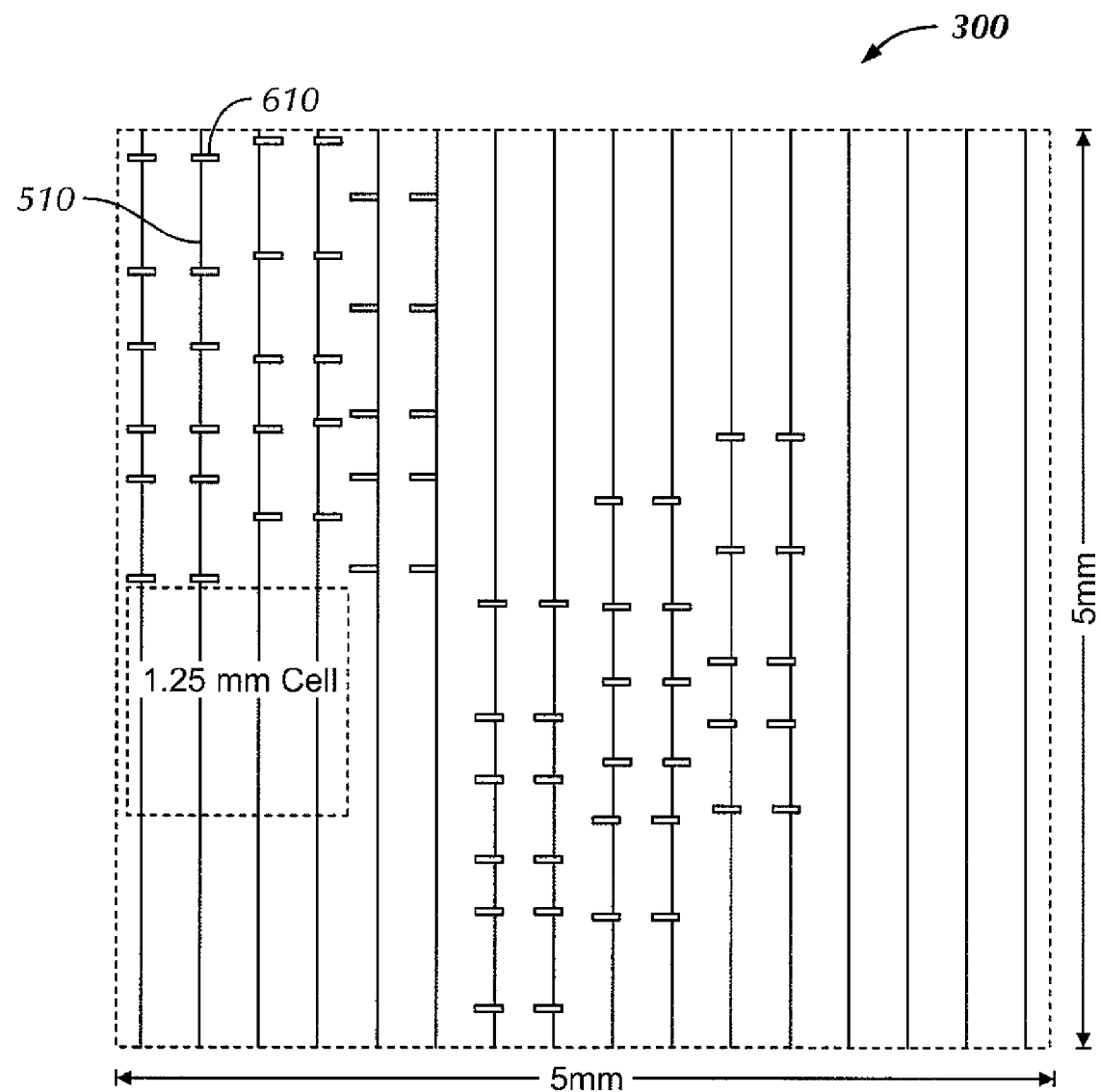
FIG. 6 shows the exemplary portion of the clock spines with clock grid drivers in accordance with one or more embodiments of the present invention.

FIG. 6 shows the exemplary portion of the clock spines with clock grid drivers in accordance with one or more embodiments of the present invention. The clock spines drive the clock grid drivers, e.g., clock spine 510 drives clock grid driver 610. The clock spines allow for the flexible placement of clock grid drivers between floorplan blocks. The clock grid drivers are placed in gaps in the floorplan at block boundaries along the Y-axis of the clock spines. The clock grid drivers have very limited freedom of movement in the X-axis direction as each clock grid driver must contact a corresponding clock spine. The floorplan has limited freedom of movement in the Y-axis direction up to approximately one bump pitch so long as the clock grid drivers maintain a maximum pitch along the Y-axis of a given clock spine.

Figure 7:
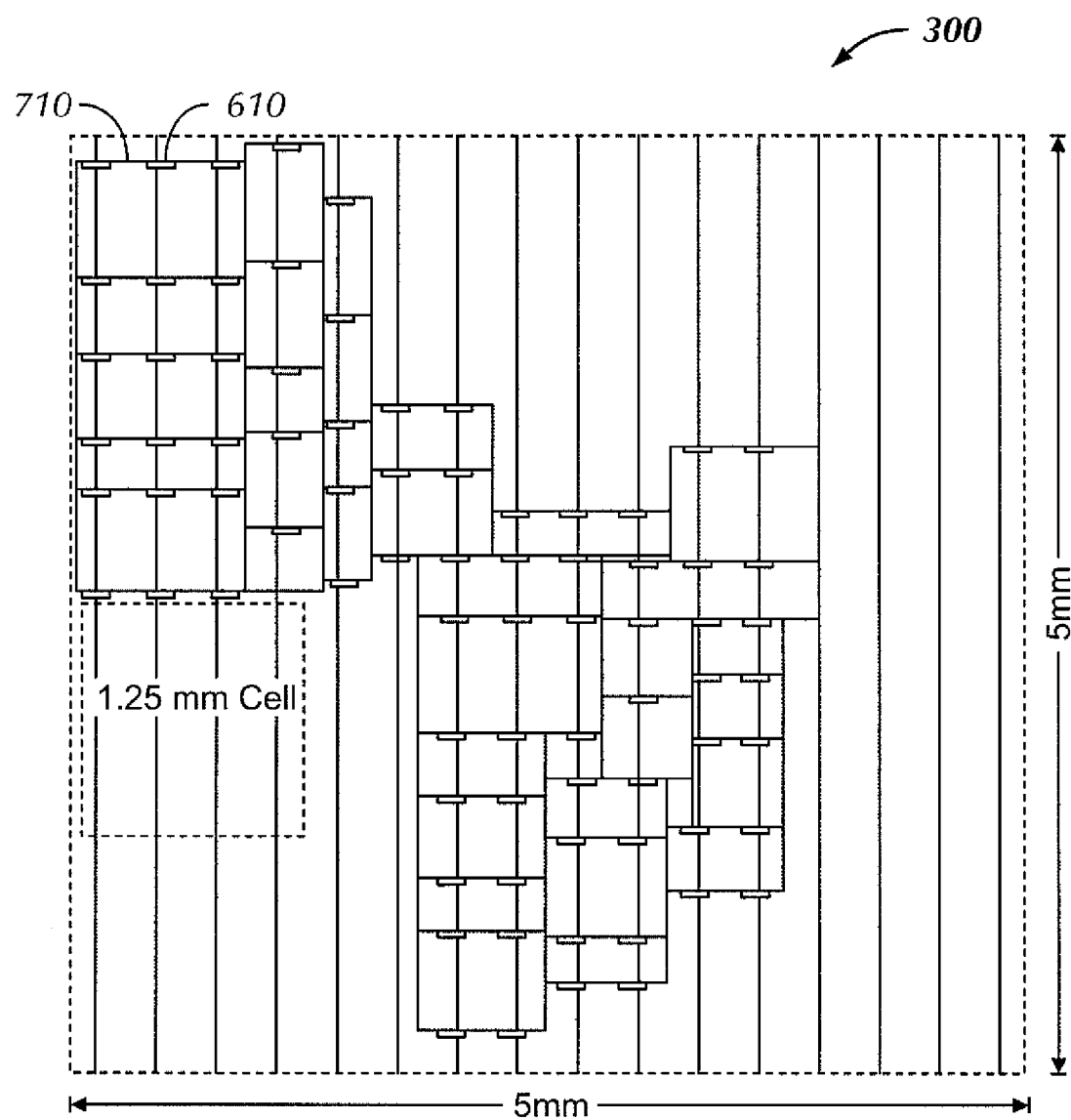
FIG. 7 shows the exemplary portion of the clock spine, clock grid drivers, and a clock grid in accordance with one or more embodiments of the present invention.

FIG. 7 shows the exemplary portion of the clock spine, clock grid drivers, and a clock grid in accordance with one or more embodiments of the present invention. The clock grid drivers drive the clock grid, e.g., clock grid driver 610 drives clock grid 710. The clock grid 710 shorts together all the outputs of the clock grid drivers. The clock grid is flexible based on the position of the clock grid drivers along the clock spines and follows the seams in the floorplan around block objects.

Figure 8:
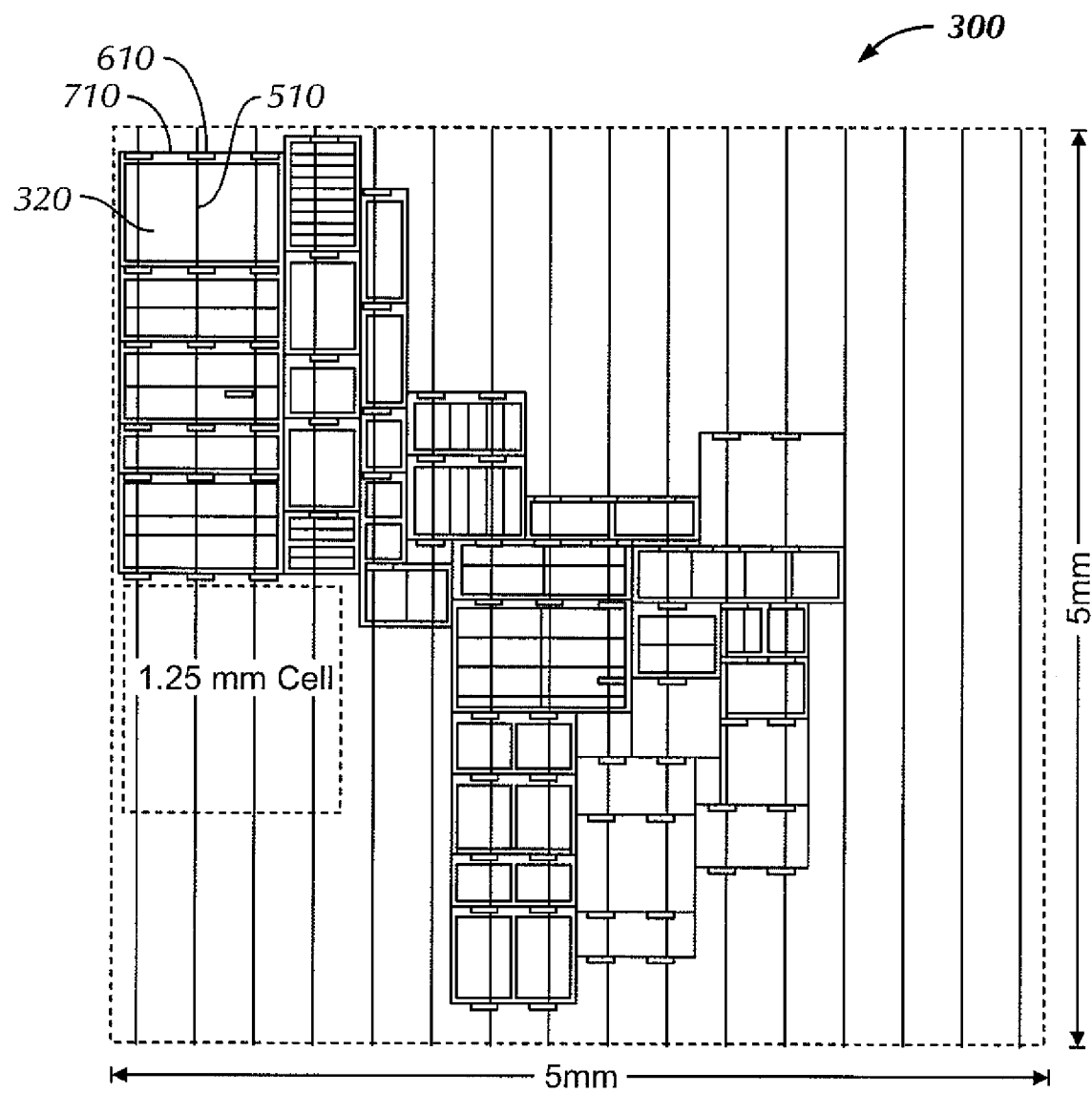
FIG. 8 shows the exemplary floorplan, clock spines, clock grid drivers, and clock grid in accordance with one or more embodiments of the present invention.

FIG. 8 shows the exemplary floorplan, clock spines, clock grid drivers, and clock grid in accordance with one or more embodiments of the present invention. Block 320 is placed within the floorplan of cluster 300. Clock spine 510 drives clock grid driver 610. Clock grid driver 610 drives clock grid 710. Clock grid 710 shorts together all the outputs of the clock grid drivers. The clock grid 710 drives the local layer (not shown) that provides the clock to the actual flip-flops and latches.

Figure 9:
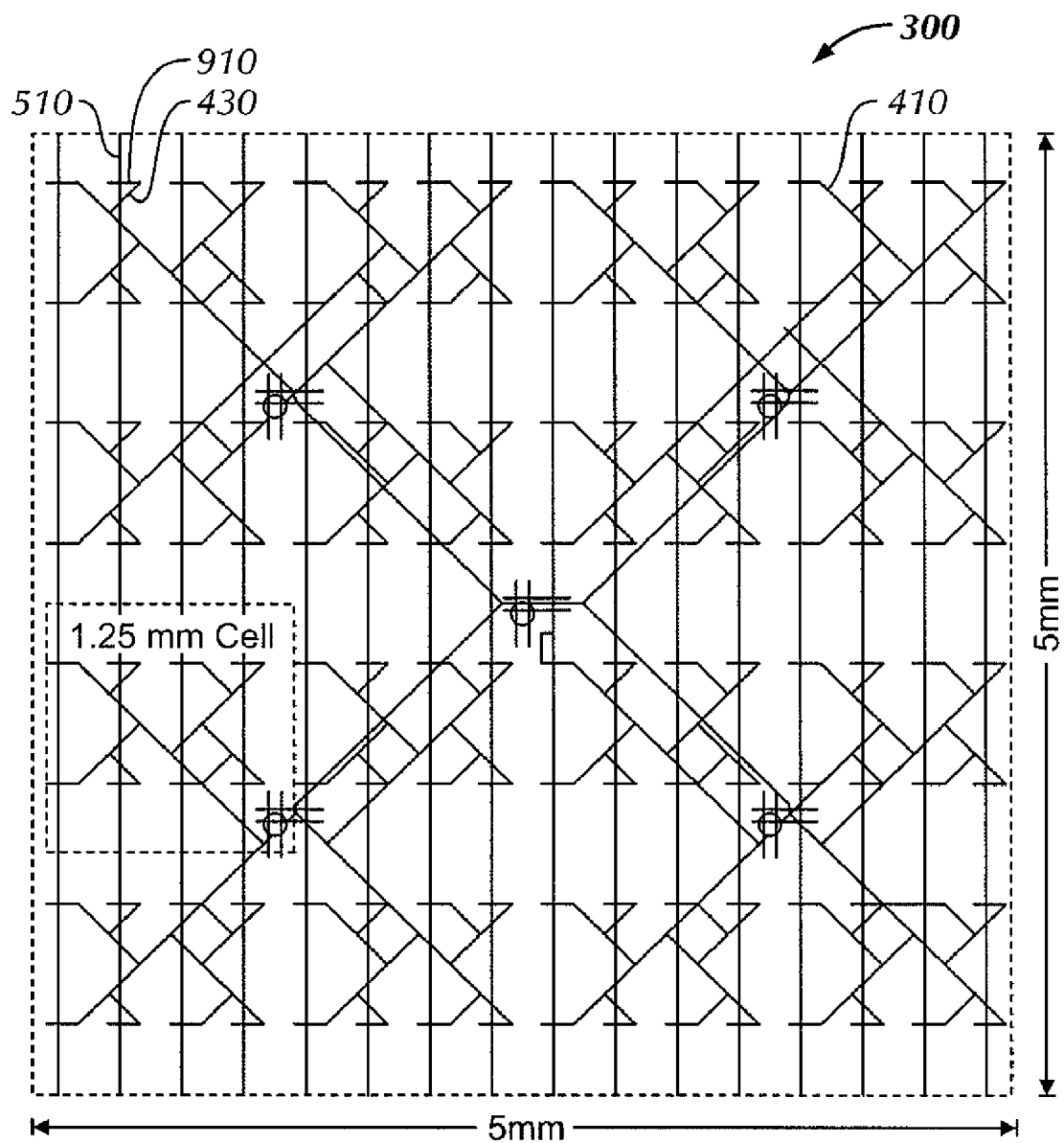
FIG. 9 shows clock wings used to correct for misalignment between the clock tree and the clock spines in accordance with one or more embodiments of the present invention.

FIG. 9 shows clock wings used to correct for misalignment between the clock tree and the clock spines in accordance with one or more embodiments of the present invention. In the event that the cluster 300 is misaligned with respect to the clock tree 410, the clock tree is misaligned with respect to the clock spines. As discussed above, the clock spines already provide for limited Y-axis movement. However, there is no facility for substantial movement in the X-axis direction to correct for the misalignment. In one or more embodiments of the present invention, clock wings are utilized to provide correction for X-axis misalignment. The clock wings are wires oriented in an X-axis direction that connect the clock tree to the clock spines. Returning to the figure, clock wing 910 connects clock tree wire 430 to clock spine 510. The clock wings are typically placed on a different metal layer of the die than that of the clock spines. One of ordinary skill in the art will recognize that the placement of the clock tree, clock spines, and clock wings in the metal stack-up of the die could vary in accordance with one or more embodiments of the present invention. The clock power and clock skew increase because of the clock wings. The increase in clock power due to the placement of the clock wings can be reduced by clipping the unused portion of the clock wings.

While the exemplary cluster 300 is 5 mm×5 mm in size, a full range of cluster sizes can be supported through the use of clipping, compression, and stretching a portion of the clock distribution network. In one or more embodiments of the present invention, the clock tree 310 can be clipped at the clock repeaters to truncate a portion of the clock tree. Clock repeater input capacitance is preserved by means of a dummy input device while the clock repeater output strength is cut to a fraction of its typical strength. In one or more embodiments of the present invention, fine adjustment to the range of cluster sizes is supported by compressing the clock tree along one or both axes. Compressions are piecewise, but not necessarily symmetrical. The compression is an integer number of pad pitches. A given compression is added all along a cut line through the cluster (either horizontally or vertically). Thus, if a compression of one is desired, it is added at the cluster center or the cluster edges. If a compression of two is desired, it is added at the clock tree repeaters. If a compression of three is desired, it is added at both the cluster center or edges and the clock tree repeaters. If a compression of four is desired, clipping is used instead.

In one or mote embodiments of the present invention, a fine adjustment to the range of cluster sizes is supported by stretching the clock tree along one or both axes. A stretch is an integer number of pad pitches. A given stretch is added to every instance of a given clock tree branch level. Thus, if a stretch of one is desired, it is added at the cluster header. If a stretch of two is desired, it is added at the clock tree repeaters. If a stretch of three is desired, it is added at both the cluster header and the clock tree repeaters. If a stretch of four is desired, clipping is used instead. Vertical stretching relies on the RC-robustness of the clock spines. A vertical stretch changes the clock spine maximum RC distance. Horizontal stretching relies on the RC-robustness of the clock grid. A vertical stretch changes the clock spines RC distance.

Figure 10:
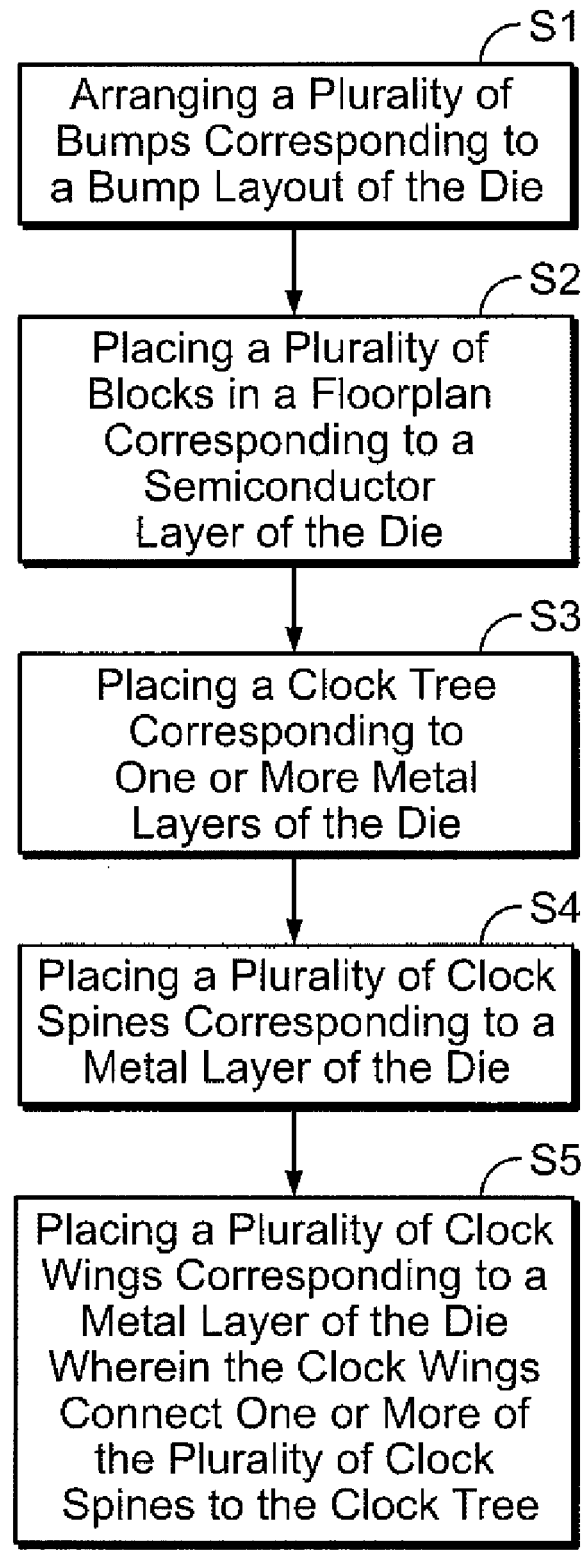
FIG. 10 shows a method of designing a semiconductor die with a flexible floorplan in accordance with one or more embodiments of the present invention.

FIG. 10 shows a method of designing a semiconductor die with a flexible floorplan in accordance with one or more embodiments of the present invention. In step S1, a plurality of bumps are arranged corresponding to a bump layout of the die. The bump layout is frozen as early as is practicable, including as early as the start of the project. The bump layout impacts the electrical design of the die and the mechanical design of the die and the package. One of ordinary skill in the art will recognize that freezing the bump layout means a given layout is deemed the candidate layout and is considered final with respect to the remaining portion of the design process. In S2, a plurality of blocks are placed in a floorplan corresponding to a semiconductor layer of the die. The floorplan of the die is created as part of the physical design process. The floorplan is re-placed if necessary. In S3, a clock tree is placed corresponding to one or more metal layers of the die. The clock tree routes are aligned between the bumps to the nearest bump array increment. The clock tree utilizes diagonal clock routes. The clock tree is flexible and can accommodate an arbitrary die floorplan. In S4, a plurality of clock spines are placed corresponding to a metal layer of the die. The clock spines connect the clock tree to clock grid drivers. In S5, a plurality of clock wings are placed corresponding to a metal layer of the die. The clock wings connect one or more of the plurality of clock spines to the clock tree. The clock wings are placed to correct for X-axis misalignment between the clock tree and the clock spines. The unused portion of the clock wings are clipped as desired.

At the local layer of the clock distribution network, another approach is required to address the RC clock skew. The RC clock skew changes with tolerance, voltage, and intra-die variation. Resistance values can vary by ±30% as a result of tolerances relating to the fabrication of metal thickness, e.g., the chemical-etching tolerance involved in the grinding of each metal layer. Relaxation, i.e., back-annotation of the RC into the timing checks, cannot recover the tolerance portion the RC skew. Further, path circuit delays will dynamically change in relative value due to dynamic voltage frequency scaling. While intra-die variation is a smaller contributor to RC skew, values of approximately 10% are common in practice.

The RC clock skew impacts the physical design of the semiconductor device. Structural skew in the clock distribution cancels in symmetrical and matched compositions such as bit-slice-only paths in data path structures. Multi-bit-slice paths and control-data paths do not enjoy this cancellation and encounter the structural skew.

The RC clock skew impacts the logic design of the semiconductor device. The static portion of the skew can be extracted from layout and back-annotated into the timing tools used. However, this occurs so late in the composition process that it is typically too late for the RTL designer to effectuate a change. Accordingly, grid and local clock distribution structures are proposed that decrease clock-user visible RC skew for the entire grid and local clock distribution.

The fan-out of a typical CMOS application is defined as the load capacitance divided by the input capacitance, $C_{load}/C_{in}$. Generally, fan-out 4 ("FO4") represents the delay of an inverter driven by an inverter four times smaller than itself and itself driving an inverter four times larger. Put another way, the minimum delay per a fixed total gain is achieved when the load is driven by a chain of inverters, each successive inverter approximately four times larger than the previous one. However, because new process generations are inherently faster, it is difficult to compare the performance of one circuit at one technology node to another circuit at another technology node. Thus, FO4 is an important design metric because circuit performance can be described in a process independent manner.

All VLSI conductors have lengths and loads over which the RC of the conductor is "negligible." Here, "negligible" has three functional meanings, each corresponding to a time and length characteristic of an application. A shorting bar has an RC of approximately 0.1×FO4 including wire and loads. The slew rate effect on the delay of driven stages is undetectable. Load coupling can pull together multiple drivers of this wire together by over-loading early drivers and under-loading late drivers. Load coupling is effective to RCs of approximately 0.5×FO4.

A short wire has an RC of approximately 1.0×FO4 including wire and loads. The slew rate effect on the delay of driven stages is minor. Load coupling is generally ineffective among multiple drivers of this wire because drivers are largely shielded from large portions of the load and each other by the wire resistance. A long wire has an RC of approximately 10+×FO4 including wire and loads. The slew rate effect on the delay of driven stages is major, but delay still scales with voltage $V_{dd}$ like static logic. Load coupling is completely ineffective. The near end transition is completed before the far end transition even begins.

At the local layer, a low RC local clock distribution can be assembled hierarchically. Shorting bars may be used to stitch together side-by-side or nearby users with their own local buffer(s). Short wires may be used to connect local buffers to a higher level buffer/clock gate. Long wires are confined to the clock distribution tree, before the grid. However, clock distributions incorporate large capacitance gain between a PLL and the state elements. As such, additional gain stages are required to allow for clock gating, mal-distribution of the clock load, and clock wiring capacitance. Biasing the transistors for efficient delay per gain is essential to minimizing the clock distribution delay. The delay per gain can be minimized through the use of FO4 design and the use of local gain.

FO4 design keeps transistors in the high-trans-conductance region of the I-V curve. Prior to discussing local gain in detail, it is important to understand the ways in which wire resistance destroys gain. A slow input transition wastes device width on crowbar and moves the receiver from FO4 operation to FO10 operation. Output wire resistance shielding makes the driver less effective, requiring a larger driver and more input gain to support it. However, local gain prevents wire resistance from degrading the gain.

Figure 11:
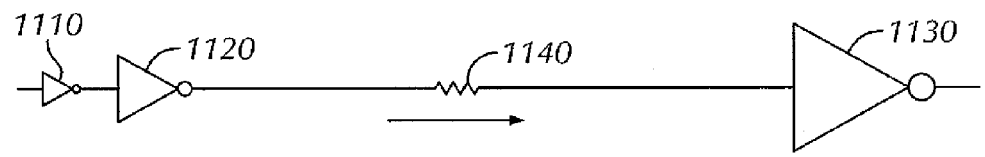
FIG. 11 shows a conventional FO4 implementation using centralized buffers.

FIG. 11 shows a conventional FO4 implementation using centralized buffers. Buffer 1110 drives buffer 1120 and buffer 1120 drives buffer 1130 through wire resistance 1140. Buffer 1130 is four times larger than buffer 1120 and buffer 1120 is four times larger than buffer 1110. Buffer 1130 is placed nearest to the load while buffer 1110 and buffer 1120 are a distance from the load. As a result, wire resistance 1140 plays an important role in the RC of the configuration depicted.

Figure 12:
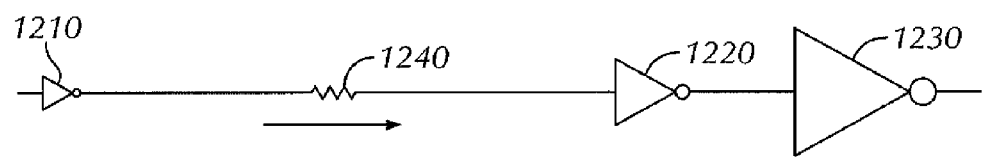
FIG. 12 shows a local gain FO4 implementation in accordance with one or more embodiments of the present invention.

FIG. 12 shows a local gain FO4 implementation in accordance with one or more embodiments of the present invention. Buffer 1210 drivers buffer 1220 through wire resistance 1240 and buffer 1220 drives buffer 1230. In contrast to the conventional FO4 implementation depicted in FIG. 11, buffer 1220 and buffer 1230 are placed as close to the load as is practical. Because of this local gain configuration, the current through wire resistance 1240 is four times smaller than the current through wire resistance 1240 at a fixed wire size. As such, wire resistance 1240 is four times less important than wire resistance 1140 at a fixed wire size. Thus, the RC of the configuration depicted in FIG. 12 is four times smaller than the RC of the configuration depicted in FIG. 11 at a fixed wire size.

Figure 13:
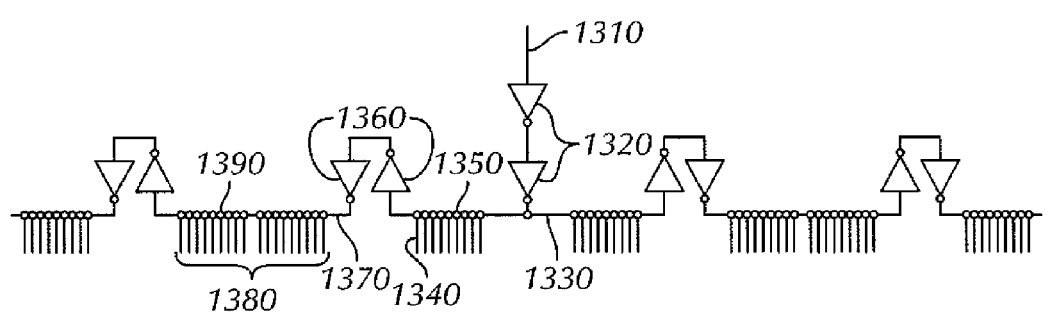
FIG. 13 shows a portion of a first low RC clock distribution structure in accordance with one or more embodiments of the present invention.

FIG. 13 shows a portion of a first low RC clock distribution structure in accordance with one or more embodiments of the present invention. A first clock 1310 is provided to a local gain buffer pair 1320. The local gain buffer pair 1320 corresponds to load side buffers 1220 and 1230 in the exemplary local gain FO4 configuration depicted in FIG. 12. The output of local gain buffer pair 1320 is a second clock 1330 that is provided to a plurality of clocks 1340 via a shorting bar 1350. The shorting bar 1350 provides the second clock 1330 to local gain buffer pair 1360. The output of local gain buffer pair 1360 is a third clock 1370 that is provided to a plurality of clocks 1380 via a shorting bar 1390. One of ordinary skill in the art will appreciate that the clock signal can be further propagated in a like manner in accordance with one or more embodiments of the present invention.

Figure 14:
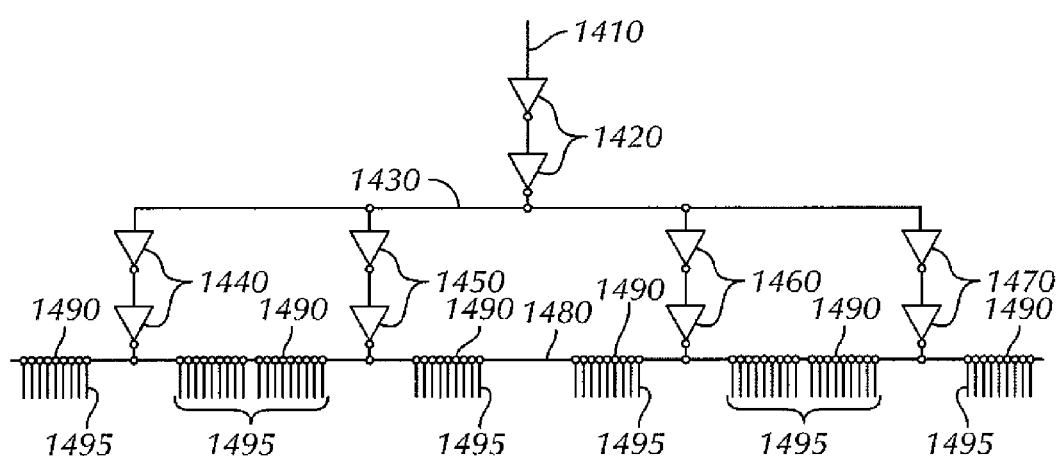
FIG. 14 shows a portion of a second low RC clock distribution structure in accordance with one or more embodiments of the present invention.

FIG. 14 shows a portion of a second low RC clock distribution structure in accordance with one or more embodiments of the present invention. A first clock 1410 is provided to a local gain buffer pair 1420. The output of the local gain buffer pair 1420 is a second clock 1430 that is provided to four loads, local gain buffer pairs 1440, 1450, 1460, and 1470. The output of the local gain buffer pairs 1440, 1450, 1460, and 1470 is a third clock 1480 that is provided to a plurality of shorting bars 1490 that each shorts the third clock 1480 to a plurality of clocks 1495, e.g., eight groups of nine conductors, each of which is a clock signal.

The shorting bar 1490 is effective if the skew from the last common ancestor, e.g., the second clock 1430 plus the structural skew due to the RC in the second clock 1430 plus the structural skew due to the RC in the third clock 1480, is much less than the transition time of the shorted node, e.g., the third clock 1480. The shorting bar 1490 is not effective if the skew from the last common ancestor is greater than the shorted node transition time, the skew between the driver inputs is greater than the shorted node transition time, or the sum of the RC and the skew is bigger than the shorted node transition time. One of ordinary skill in the art will appreciate that other configurations of a low RC clock distribution structure can be achieved through the use of FO4 design and local gain in accordance with one or more embodiments of the present invention.

Figure 15:
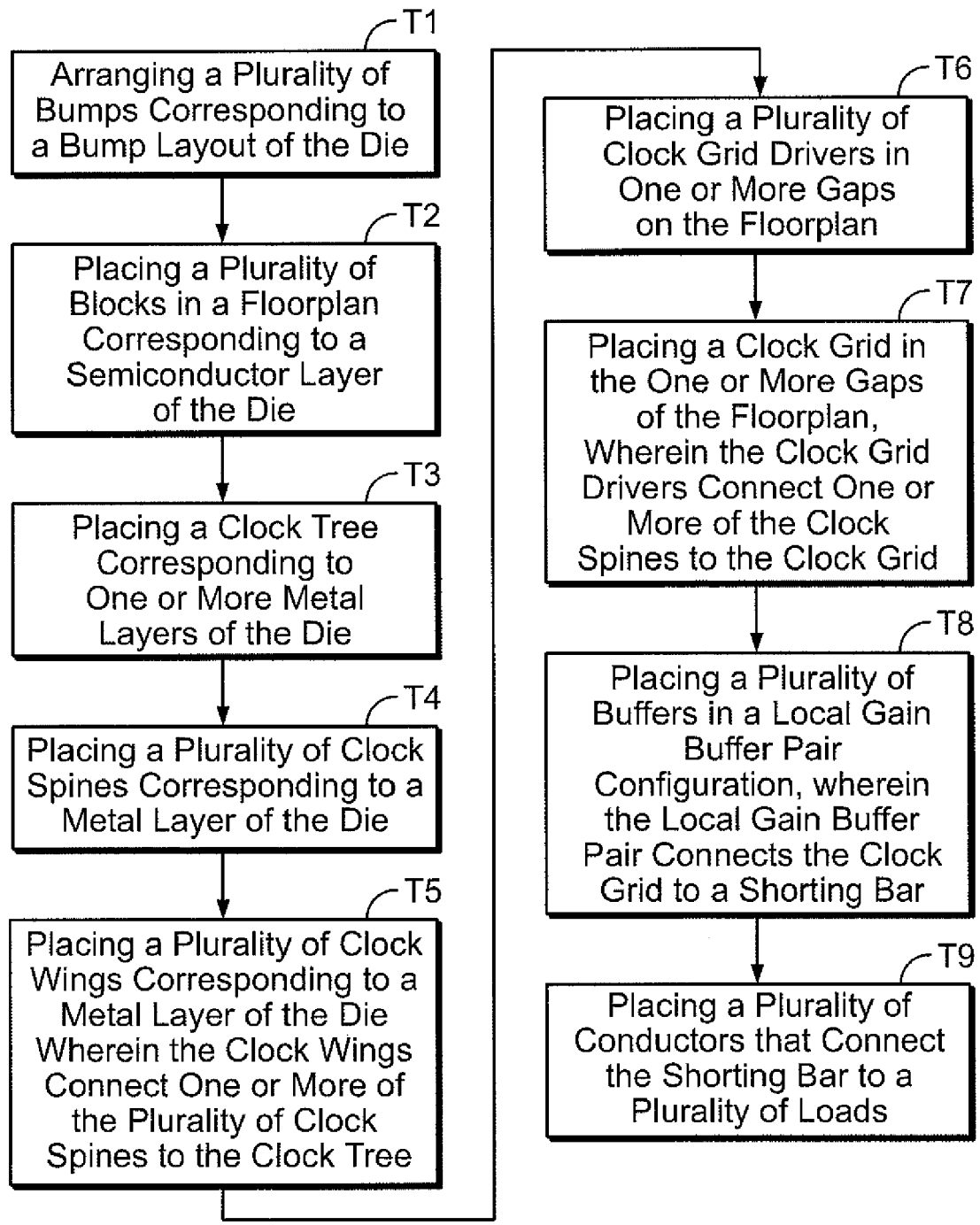
FIG. 15 shows a method of designing a semiconductor die with a low RC global clock distribution in accordance with one or more embodiments of the present invention.

FIG. 15 shows a method of designing a semiconductor die with a low RC global clock distribution in accordance with one or more embodiments of the present invention. In step T1, a plurality of bumps are arranged corresponding to a bump layout of the die. The bump layout is frozen as early as is practicable, including as early as the start of the project. The bump layout impacts the electrical design of the die and the mechanical design of the die and the package. One of ordinary skill in the art will recognize that freezing a bump layout means a given layout is deemed the candidate layout and is considered final with respect to the remaining portion of the design process. In T2, a plurality of blocks are placed in a floorplan corresponding to a semiconductor layer of the die. The floorplan of the die is created as part of the physical design process. The floorplan is re-placed if necessary. In T3, a clock tree is placed corresponding to one or more metal layers of the die. The clock tree routes are aligned between the bumps to the nearest bump array increment. The clock tree utilizes diagonal clock routes. The clock tree is flexible and can accommodate an arbitrary die floorplan.

In T4, a plurality of clock spines are placed corresponding to a metal layer of the die. The clock spines connect the clock tree to clock grid drivers. In T5, a plurality of clock wings are placed corresponding to a metal layer of the die. The clock wings connect one or more of the plurality of clock spines to the clock tree. The clock wings are placed to correct for X-axis misalignment between the clock tree and the clock spines. The unused portion of the click wings are clipped as desired. In T6, a plurality of clock grid drivers are placed in one or more gaps of the floorplan. In T7, a clock grid is placed in the one or more gaps of the floorplan. The clock grid drivers connect the clock spine to the clock grid. In T8, a plurality of buffers is placed in a local gain buffer pair configuration. The local gain buffer pair connects the clock grid to a shorting bar. In T9, a plurality of conductors are placed connecting the shorting bar to a plurality of loads.

Advantages of one or more embodiments of the present invention may include one or more of the following.

In one or more embodiments of the present invention, the low RC global clock distribution does not lock the floorplan to the bump layout. The bump layout may be frozen as early as is practicable, including as early as the start of the project. The clock distribution can be aligned to the nearest bump array increment.

In one or more embodiments of the present invention, the low RC global clock distribution provides for a floorplan that is only constrained by the space required for the placement of clock grid drivers and gaps within the block to accommodate the clock grid (or the use of blocks smaller than the corresponding portion of the clock grid).

In one or more embodiments of the present invention, the low RC global clock distribution provides correction for X-axis misalignment between the clock tree and the clock spines. Clock wings are utilized to provide correction for X-axis misalignment between the clock tree and the clock spines.

In one or more embodiments of the present invention, the low RC global clock distribution allows for Y-axis movement by sliding the clock grid drivers along the clock spines. Additional movement is accommodated by snapping the bump array to multiples of the bump array Y-pitch.

In one or more embodiments of the present invention, the low RC global clock distribution provides for reduced power consumption.

In one or more embodiments of the present invention, the low RC global clock distribution provides for reduced power consumption by reducing the number of clock repeaters needed.

In one or more embodiments of the present invention, the low RC global clock distribution provides for reduced power consumption by clipping the unused portion of the clock wings.

In one or more embodiments of the present invention, the low RC global clock distribution, combined with fast clock repeaters on the diagonal clock routes, satisfies the timing requirements needed for effective shorting bars at the local layer. Effective shorting bars strap many more devices in parallel and reduce skew due to random device variation.

In one or more embodiments of the present invention, the low RC global clock distribution reduces clock-user visible RC skew for the entire grid layer and local layer of the clock distribution. The local gain buffer pair configuration renders the wire resistance less important to the RC skew.

In one or more embodiments of the present invention, the low RC global clock distribution can be assembled hierarchically using shorting bars to stitch together side-by-side or nearby users with their own local buffer(s). Short wires can connect the local buffers to a high level buffer/clock gate. Long wires are confined to the clock distribution tree, before the grid layer.

In one or more embodiments of the present invention, the low RC global clock distribution improves clock skew and slew rates across process manufacturing tolerance and dynamic voltage frequency scaling operating voltage.

In one or more embodiments of the present invention, the low global RC clock distribution decreases logic circuit delay by reducing the cycle fraction consumed by clock and hold time padding.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computer implemented method of designing a semiconductor die with a flexible floorplan comprising:
    arranging a plurality of bumps that connect the die to a mechanical package, the plurality of bumps corresponding to a bump layout of the die;
    placing a plurality of blocks in a floorplan corresponding to a semiconductor layer of the die;
    placing a clock tree corresponding to one or more metal layers of the die;
    placing a plurality of clock spines corresponding to a metal layer of the die; and
    placing a plurality of clock wings corresponding to a metal layer of the die;
    wherein the clock wings connect one or more of the plurality of clock spines to the clock tree; and
    wherein the clock tree is comprised of a plurality of wires arranged at a planar angle of 45 degrees.

2. A computer implemented method of designing a semiconductor die with a flexible floorplan comprising:
    arranging a plurality of bumps that connect the die to a mechanical package, the plurality of bumps corresponding to a bump layout of the die;
    placing a plurality of blocks in a floorplan corresponding to a semiconductor layer of the die;
    placing a clock tree corresponding to one or more metal layers of the die;
    placing a plurality of clock spines corresponding and placing a plurality of clock wings corresponding to a metal layer of the die;
    wherein the clock wings connect one or more of the plurality of clock spines to the clock tree,
    wherein the clock tree is comprised of a plurality of wires arranged at a planar angle of 45 degrees; and
    wherein the clock tree provides for diagonal clock routes.

3. A computer implemented method of designing a semiconductor die with a flexible floorplan comprising:
    arranging a plurality of bumps that connect the die to a mechanical package, the plurality of bumps corresponding to a bump layout of the die;
    placing a plurality of blocks in a floorplan corresponding to a semiconductor layer of the die;
    placing a clock tree corresponding to one or more metal layers of the die;
    placing a plurality of clock spines corresponding to a metal layer of the die; and
    placing a plurality of clock wings corresponding to a metal layer of the die;
    wherein the clock wings connect one or more of the plurality of clock spines to the clock tree;
    placing a plurality of clock grid drivers in one or more gaps of the floorplan;

placing a clock grid in the one or more gaps of the floorplan, wherein the clock grid drivers connect one or more of the clock spines to the clock grid;

placing a plurality of buffers in a local gain buffer pair configuration, wherein the local gain buffer pair connects the clock grid to a shorting bar; and placing a plurality of conductors that connect the shorting bar to a plurality of loads.

4. The method of claim 3, the method further comprising: clipping an unused portion of each clock wing.

5. The method of claim 3, wherein the clock tree is comprised of a plurality of wires arranged at a planar angle of 45 degrees.

6. The method of claim 5, wherein the clock tree provides for diagonal clock routes.

7. The method of claim 3, wherein the local gain buffer pair corresponds to a second buffer and a third buffer as part of a three-stage FO4 local gain configuration.

8. A semiconductor device comprising:
a mechanical package; and
a semiconductor die comprising:
   a semiconductor layer,
   a plurality of metal layers,
   a clock distribution network that distributes a clock signal within the die, and
   a plurality of bumps that connect the die to the mechanical package;
wherein the clock distribution network comprises a low RC global clock distribution, the low RC global clock distribution comprising:
a clock tree corresponding to one or more metal layers of the die,
a plurality of clock spines corresponding to a metal layer of the die,
a plurality of clock wings corresponding to a metal layer of the die, wherein the clock wings connect one or more of the clock spines to the clock tree,
a plurality of clock grid drivers placed in one or more gaps of a floorplan corresponding to the semiconductor layer of the die;
a clock grid placed in the one or more gaps of the floorplan, wherein the clock grid drivers connect one or more of the clock spines to the clock grid,
a plurality of buffers placed in a local gain buffer pair configuration, wherein the local gain buffer pair connects the clock grid to a shorting bar, and
a plurality of conductors that connect the shorting bar to a plurality of loads.

9. The semiconductor device of claim 8, wherein the unused portion of the clock wings are clipped.

10. The semiconductor device of claim 8, wherein the clock tree is comprised of a plurality of wires arranged at a planar angle of 45 degrees.

11. The semiconductor device of claim 10, wherein the clock tree provides for diagonal clock routes.

12. The semiconductor device of claim 10, wherein the local gain buffer pair corresponds to a second buffer and a third buffer as part of a three-staged FO4 local gain configuration.

13. A system comprising:
an input device;
an output device;
a mechanical chassis;
a printed circuit board; and
a semiconductor device comprising:
   a mechanical package, and
   a semiconductor die;
wherein the semiconductor die comprises:
   a semiconductor layer,
   a plurality of metal layers,
   a clock distribution network that distributes a clock signal within the die, and
   a plurality of bumps that connect the die to the mechanical package; and
wherein the clock distribution network comprises a low RC global clock distribution, the low RC global clock distribution comprising:
a clock tree corresponding to one or more metal layers of the die,
a plurality of clock spines corresponding to a metal layer of the die,
a plurality of clock wings corresponding to a metal layer of the die, wherein the clock wings connect one or more of the clock spines to the clock tree,
a plurality of clock grid drivers placed in one or more gaps of a floorplan corresponding to the semiconductor layer of the die;
a clock grid placed in one or more gaps of the floorplan, wherein the clock grid drivers connect one or more of the clock spines to the clock grid,
a plurality of buffers placed in a local gain buffer pair configuration, wherein the local gain buffer pair connects the clock grid to a shorting bar, and
a plurality of conductors that connect the shorting bar to a plurality of loads.

14. The system of claim 13, wherein the unused portion of the clock wings are clipped.

15. The system of claim 13, wherein the clock tree is comprised of a plurality of wires arranged at a planar angle of 45 degrees.

16. The system of claim 15, wherein the clock tree provides for diagonal clock routes.

17. The system of claim 13, wherein the local gain buffer pair corresponds to a second buffer and a third buffer as part of a three-stage FO4 local gain configuration.

* * * * *

UNITED STATES PATENT AND TRADEMARK OFFICE
CERTIFICATE OF CORRECTION

PATENT NO. : 8,214,790 B2
APPLICATION NO. : 12/397941
DATED : July 3, 2012
INVENTOR(S) : Robert P. Masleid et al.

Page 1 of 1

It is certified that error appears in the above-identified patent and that said Letters Patent is hereby corrected as shown below:

In the claims:

- In Claim 2, Column 10 (line 43), to a metal layer of the die;-- should be added after "corresponding".

- In Claim 12, Column 12 (line 3), replace "10" with --8--.

- In Claim 12, Column 12 (line 5), replace "three-staged" with --three-stage--.

Signed and Sealed this
Twenty-first Day of August, 2012

David J. Kappos
*Director of the United States Patent and Trademark Office*